US010418470B2

United States Patent
Gejo et al.

(10) Patent No.: US 10,418,470 B2
(45) Date of Patent: Sep. 17, 2019

(54) SEMICONDUCTOR DEVICE HAVING IGBT PORTION AND DIODE PORTION

(71) Applicants: Kabushiki Kaisha Toshiba, Minato-ku (JP); Toshiba Electronic Devices & Storage Corporation, Minato-ku (JP)

(72) Inventors: Ryohei Gejo, Kanazawa (JP); Kazutoshi Nakamura, Nonoichi (JP); Norio Yasuhara, Kanazawa (JP); Tomohiro Tamaki, Nonoichi (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 15/912,600

(22) Filed: Mar. 6, 2018

(65) Prior Publication Data
US 2019/0081162 A1  Mar. 14, 2019

(30) Foreign Application Priority Data
Sep. 14, 2017 (JP) .................. 2017-176263

(51) Int. Cl.
*H01L 27/06* (2006.01)
*H01L 29/739* (2006.01)
(Continued)

(52) U.S. Cl.
CPC ...... *H01L 29/7397* (2013.01); *H01L 27/0664* (2013.01); *H01L 27/0727* (2013.01);
(Continued)

(58) Field of Classification Search
CPC ............. H01L 29/7397; H01L 29/4236; H01L 27/0727; H01L 29/861; H01L 27/0664;
(Continued)

(56) References Cited

U.S. PATENT DOCUMENTS 6,936,890 B2 * 8/2005 Hueting .............. H01L 29/0696
257/330
8,120,104 B2 * 2/2012 Fujii .................... H01L 29/739
257/139
(Continued)

FOREIGN PATENT DOCUMENTS

| JP | 5045733 | 10/2012 |
|----|---------|---------|
| JP | 2013-152996 | 8/2013 |
| JP | 2014-75582 | 4/2014 |

OTHER PUBLICATIONS

M. Rahimo, et al., "The Bi-mode Insulated Gate Transistor (BIGT) A Potential Technology for Higher Power Applications", Power Semiconductor Devices & IC's, 2009, IEEE, pp. 283-286.
(Continued)

*Primary Examiner* — Jarrett J Stark
(74) *Attorney, Agent, or Firm* — Oblon, McClelland, Maier & Neustadt, L.L.P.

(57) ABSTRACT

A semiconductor device according to an embodiment includes a first diode portion including a first trench extending in a first direction, and a first trench electrode; a second diode portion adjacent to the first diode portion in the first direction and includes a second trench extending in the first direction, and a second trench electrode and of which the width in the first direction is greater than the width of the first diode portion in a second direction perpendicular to the first direction; and a first IGBT portion adjacent to the first diode portion in the second direction and is adjacent to the second diode portion in the first direction and includes a third trench extending in the first direction, and a first gate electrode.

11 Claims, 13 Drawing Sheets

(51) Int. Cl.
*H01L 29/08* (2006.01)
*H01L 29/861* (2006.01)
*H01L 27/07* (2006.01)
*H01L 29/423* (2006.01)
*H01L 29/06* (2006.01)

(52) U.S. Cl.
CPC ...... *H01L 29/0834* (2013.01); *H01L 29/4236* (2013.01); *H01L 29/861* (2013.01); *H01L 29/0692* (2013.01)

(58) Field of Classification Search
CPC ............. H01L 29/0834; H01L 29/0692; H01L 27/0611–0635; H01L 27/0652; H01L 27/0647
See application file for complete search history.

(56) References Cited

U.S. PATENT DOCUMENTS

| | | | |
|---|---|---|---|
| 8,288,824 B2 | 10/2012 | Tsuzuki et al. | |
| 8,304,829 B2* | 11/2012 | Yedinak | H01L 29/7397 257/334 |
| 8,866,222 B2* | 10/2014 | Weber | H01L 29/7816 257/340 |
| 9,023,692 B2* | 5/2015 | Yoshida | H01L 29/66128 438/133 |
| 9,123,769 B2* | 9/2015 | Kim | H01L 29/66333 |
| 9,153,575 B2* | 10/2015 | Kimura | H01L 29/7397 |
| 9,691,844 B2* | 6/2017 | Kim | H01L 29/0619 |
| 9,960,165 B2* | 5/2018 | Horiuchi | H01L 29/78 |
| 10,026,728 B1* | 7/2018 | Agam | H01L 27/0259 |
| 2015/0349103 A1* | 12/2015 | Onozawa | H01L 29/7397 257/144 |
| 2016/0268181 A1* | 9/2016 | Yasuhara | H01L 29/51 |
| 2016/0284803 A1* | 9/2016 | Baburske | H01L 21/268 |
| 2018/0061971 A1* | 3/2018 | Bhojani | H01L 27/0222 |
| 2018/0190649 A1* | 7/2018 | Laven | H01L 27/0635 |
| 2018/0190805 A1* | 7/2018 | Liu | H01L 29/423 |
| 2018/0226399 A1* | 8/2018 | Tamaki | H01L 27/0664 |
| 2018/0226487 A1* | 8/2018 | Oota | H01L 29/66348 |
| 2018/0269202 A1* | 9/2018 | Yamano | H01L 27/0664 |
| 2018/0277667 A1* | 9/2018 | Sekiguchi | H01L 21/28518 |
| 2018/0308839 A1* | 10/2018 | Takahashi | H01L 29/8613 |
| 2019/0027591 A1* | 1/2019 | Naito | H01L 29/7397 |

OTHER PUBLICATIONS

L. Storasta, et al., "The Radial Layout Design Concept for the Bi-mode Insulated Gate Transistor", Proceedings of the 23rd International Symposium on Power Semiconductor Devices & IC's, 2011 IEEE, pp. 56-59.

* cited by examiner

FIG.3 CROSS SECTION TAKEN ALONG LINE A-A'

SEMICONDUCTOR DEVICE HAVING IGBT PORTION AND DIODE PORTION

CROSS-REFERENCE TO RELATED APPLICATION

This application is based upon and claims the benefit of priority from Japanese Patent Application No. 2017-176263, filed on Sep. 14, 2017, the entire contents of which are incorporated herein by reference.

FIELD

Embodiments described herein relate generally to semiconductor devices.

BACKGROUND

In a reverse conducting (RC)-insulated gate bipolar transistor (IGBT), an IGBT portion in which an IGBT is formed and a diode portion which is adjacent to the IGBT portion and in which a diode is formed are formed in the same semiconductor layer. In the RC-IGBT, during a forward operation of the diode, when a voltage is applied to a gate electrode of the adjacent IGBT portion, a channel is formed and carriers are emitted. Therefore, there is a concern that snapback will occur in the current-voltage characteristics of the diode. For example, in a case in which a plurality of RC-IGBTs are connected in parallel to each other, when snapback occurs in the diode portion, there is a concern that a current is concentrated on a specific RC-IGBT and the specific RC-IGBT will be broken.

DETAILED DESCRIPTION

Figure 1:
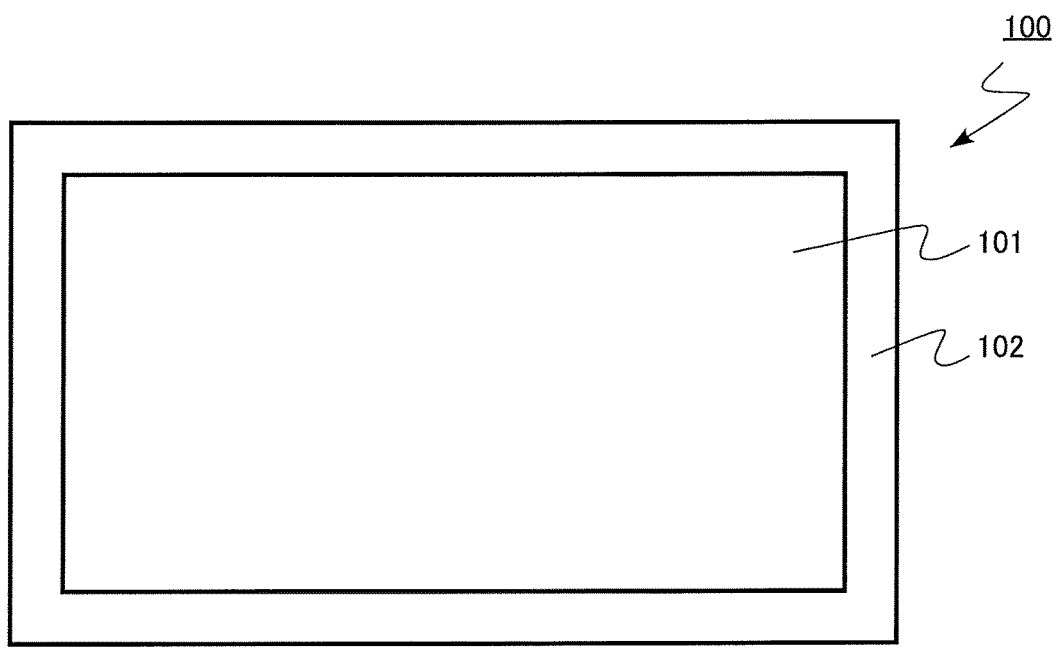
FIG. 1 is a plan view schematically illustrating a semiconductor device according to a first embodiment.

Hereinafter, embodiments of the invention will be described with reference to the drawings. In the following description, for example, the same or similar members are denoted by the same reference numerals and the description of the members that have been described once will not be repeated.

In the following description, in some cases, $n^+$, n, $n^-$, $p^+$, and $p^-$ indicate the relative impurity concentration levels of each conductivity type. That is, $n^+$ indicates a higher n-type impurity concentration than n and $n^-$ indicates a lower n-type impurity concentration than n.

In addition, $p^|$ indicates a higher p-type impurity concentration than p and $p^-$ indicates a lower p-type impurity concentration than p. In some cases, an n type and an $n^-$ type are simply referred to as an n type and a $p^+$ type and a $p^-$ type are simply referred to as a p type.

First Embodiment

A semiconductor device according to a first embodiment includes a first diode portion, a second diode portion, and a first IGBT portion. The first diode portion includes: a first anode region of a first conductivity type provided in a semiconductor layer having a first plane and a second plane; a first cathode region of a second conductivity type provided between the first anode region and the second plane; a drift region of the second conductivity type which is provided between the first anode region and the first cathode region and has a lower second-conductivity-type impurity concentration than the first cathode region; a first trench which is provided in the semiconductor layer and extends in a first direction; a first trench insulating film provided in the first trench; and a first trench electrode which is provided on the first trench insulating film in the first trench and is electrically connected to the first anode region. The second diode portion includes: a second anode region of the first conductivity type provided in the semiconductor layer; a second cathode region of the second conductivity type provided between the second anode region and the second plane; the drift region provided between the second anode region and the second cathode region; a second trench which is provided in the semiconductor layer and extends in the first direction; a second trench insulating film provided in the second trench; and a second trench electrode which is provided on the second trench insulating film in the second trench and is electrically connected to the second anode region. A width of the second diode portion in the first direction is greater than a width of the first diode portion in a second direction perpendicular to the first direction. The second diode portion is provided so as to be adjacent to the first diode portion in the first direction. The first IGBT portion includes: a first emitter region of the second conductivity type provided in the semiconductor layer; a first collector region of the first conductivity type provided between the first emitter region and the second plane; the drift region provided between the first emitter region and the first collector region; a first base region of the first conductivity type provided between the first emitter region and the drift region; a third trench which is provided in the semiconductor layer and extends in the first direction; a first gate insulating film provided in the third trench; and a first gate electrode provided on the first gate insulating film in the third trench. The first IGBT portion is provided such that it is adjacent to the first diode portion in the second direction and is adjacent to the second diode portion in the first direction.

FIG. 1 is a plan view schematically illustrating the semiconductor device according to the first embodiment. The semiconductor device according to the first embodiment is an RC-IGBT 100 having a trench structure.

The RC-IGBT 100 includes an active region 101 and a termination region 102 that surrounds the active region 101.

The active region 101 functions as a region in which a current flows when the RC-IGBT 100 is turned on. The termination region 102 functions as a region which reduces the strength of the electric field applied to an end portion of the active region 101 when the RC-IGBT 100 is turned off to improve the breakdown voltage of the RC-IGBT 100.

Figure 2:
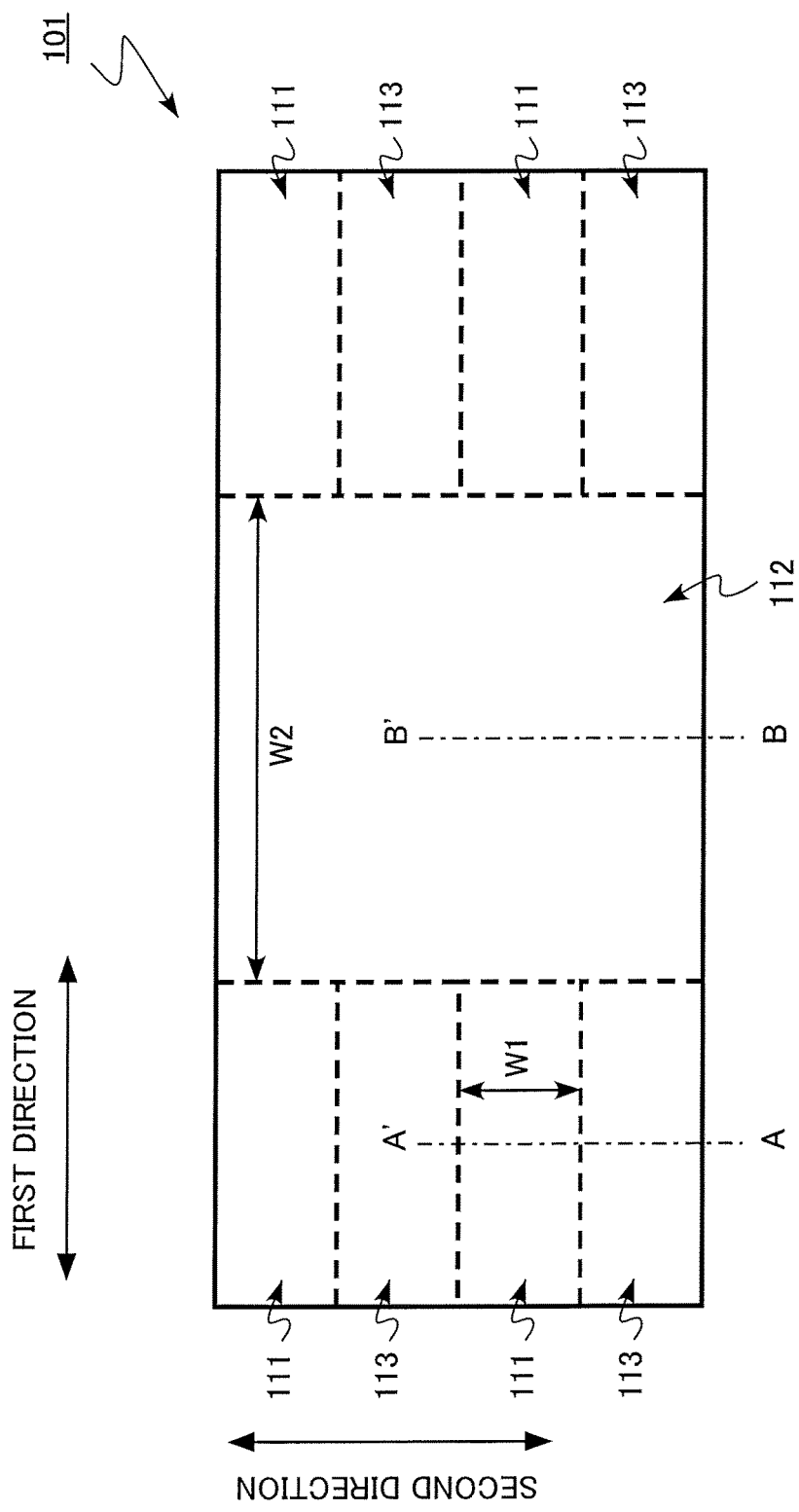
FIG. 2 is a plan view schematically illustrating an active region of the semiconductor device according to the first embodiment.

FIG. 2 is a plan view schematically illustrating the active region of the semiconductor device according to the first embodiment. The active region 101 includes a plurality of cell diode portions 111 (first diode portions), a leading diode portion 112 (second diode portion), and a plurality of cell IGBT portions 113 (first IGBT portions). In FIG. 2, a first direction and a second direction are perpendicular to each other.

The cell diode portion 111 and the cell IGBT portion 113 are adjacent to each other in the second direction. The cell diode portion 111 and the cell IGBT portion 113 are alternately arranged in the second direction.

The leading diode portion 112 is provided so as to be adjacent to the cell diode portion 111 in the first direction.

In addition, the cell IGBT portion 113 is provided so as to be adjacent to the leading diode portion 112 in the first direction.

Figure 3:
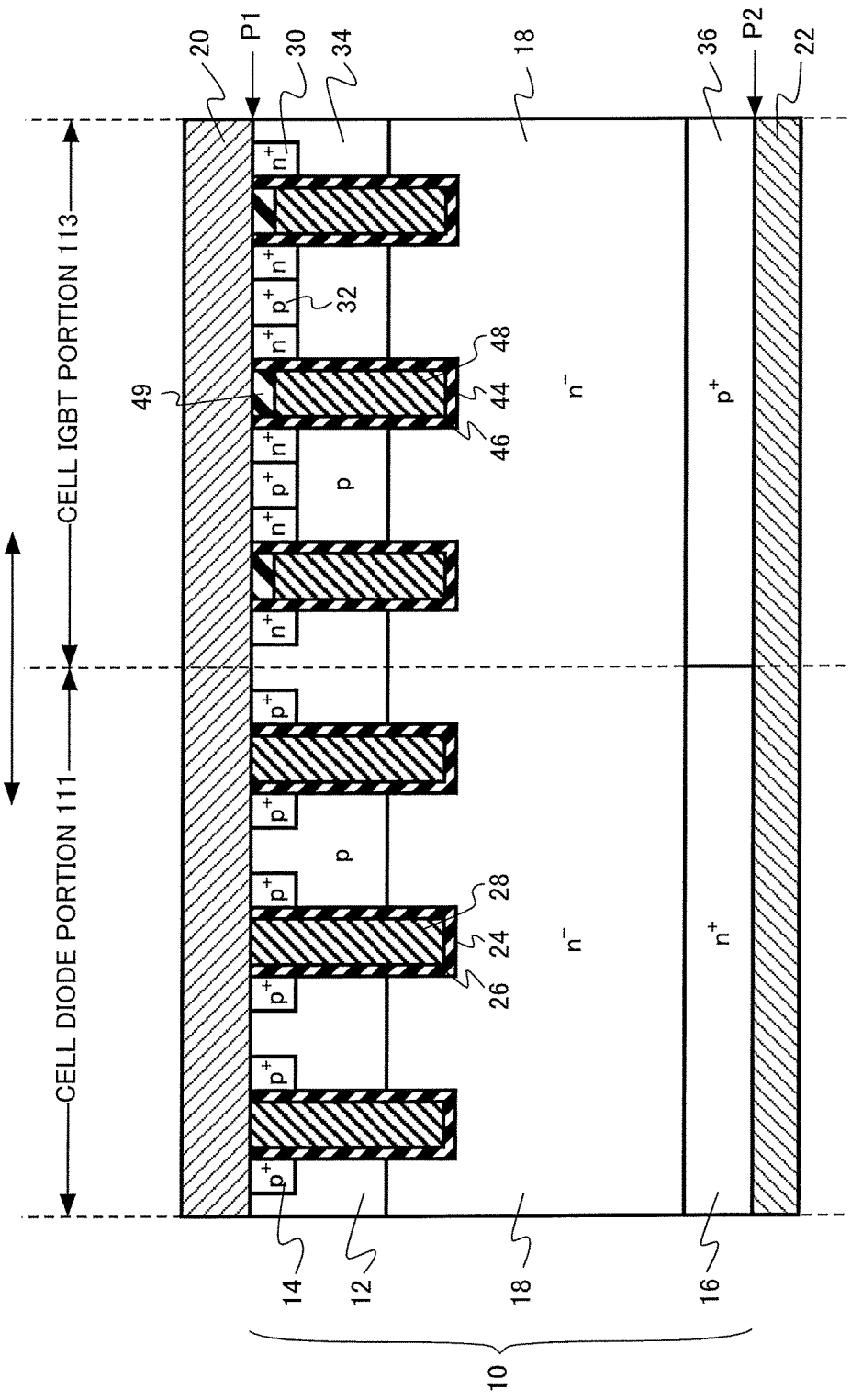
FIG. 3 is a cross-sectional view schematically illustrating a portion of the active region of the semiconductor device according to the first embodiment.

FIG. 3 is a cross-sectional view schematically illustrating a portion of the active region of the semiconductor device according to the first embodiment. FIG. 3 illustrates the cross section taken along the line A-A' of FIG. 2. FIG. 3 is a cross-sectional view illustrating the cell diode portion 111 and the cell IGBT portion 113.

A diode is provided in the cell diode portion 111. The cell diode portion 111 includes a semiconductor layer 10, a p-type anode region 12 (first anode region), a p$^+$ contact region 14, an n$^+$ cathode region 16 (first cathode region), an n$^-$ drift region 18, a first common electrode 20, and a second common electrode 22. In addition, the cell diode portion 111 includes a trench 24 (first trench), a trench insulating film 26 (first trench insulating film), and a trench electrode 28 (first trench electrode).

The semiconductor layer 10 has a first plane P1 (hereinafter, also referred to as a front surface P1) and a second plane P2 (hereinafter, also referred to as a rear surface P2) opposite to the first plane. The semiconductor layer 10 is made of, for example, single-crystal silicon.

The p-type anode region 12 is provided in the semiconductor layer 10. The anode region 12 includes p-type impurities. The p-type impurities are, for example, boron (B).

The p$^+$ contact region 14 is provided so as to come into contact with the front surface P1 of the semiconductor layer 10. The contact region 14 includes p-type impurities. The p-type impurities are, for example, boron (B). The p-type impurity concentration of the contact region 14 is higher than the p-type impurity concentration of the anode region 12. The contact region 14 has a function of reducing the contact resistance of the first common electrode 20.

The n$^+$ cathode region 16 is provided between the anode region 12 and the rear surface P2 of the semiconductor layer 10. The cathode region 16 is provided so as to come into contact with the rear surface P2 of the semiconductor layer 10. The cathode region 16 includes n-type impurities. The n-type impurities are, for example, phosphorus (P) or arsenic (As). The cathode region 16 has a function of reducing the contact resistance of the second common electrode 22.

The n$^-$ drift region 18 is provided between the anode region 12 and the cathode region 16. The drift region 18 includes n-type impurities. The n-type impurities are, for example, phosphorus (P).

The trench 24 is provided in the semiconductor layer 10. The trench 24 is provided in the first plane of the semiconductor layer 10. The trench 24 extends in the first direction. The trench 24 passes through the anode region 12 and has a bottom located in the drift region 18.

The trench insulating film 26 is provided in the trench 24. The trench insulating film 26 is made of, for example, silicon oxide.

The trench electrode 28 is provided in the trench 24. The trench electrode 28 is provided on the trench insulating film 26. The trench electrode 28 comes into contact with the first common electrode 20. The trench electrode 28 is electrically connected to the first common electrode 20 and the anode region 12. The trench electrode 28 is made of, for example, polysilicon including conductive impurities.

The first common electrode 20 is provided on the front surface P1 of the semiconductor layer 10. The first common electrode 20 is a metal electrode. The first common electrode 20 comes into contact with the trench electrode 28. The first common electrode 20 functions as an anode electrode of the diode in the cell diode portion 111. The contact between the first common electrode 20 and the contact region 14 is an ohmic contact.

The second common electrode 22 is provided on the rear surface P2 of the semiconductor layer 10. The second common electrode 22 is a metal electrode. The second common electrode 22 functions as a cathode electrode of the diode in the cell diode portion 111. The contact between the second common electrode 22 and the cathode region 16 is an ohmic contact.

An IGBT is provided in the cell IGBT portion 113. The cell IGBT portion 113 includes the semiconductor layer 10, an n$^+$ emitter region 30 (first emitter region), a p$^+$ contact region 32, a p-type base region 34 (first base region), a p$^+$ collector region 36 (first collector region), the n$^-$ drift region 18, the first common electrode 20, and the second common electrode 22. In addition, the cell IGBT portion 113 includes a trench 44 (third trench), a gate insulating film 46 (first gate insulating film), a gate electrode 48 (first gate electrode), and an insulating layer 49.

The emitter region 30 is provided in the semiconductor layer 10. The n$^+$ emitter region 30 is provided so as to come into contact with the front surface P1 of the semiconductor layer 10. The n$^+$ emitter region 30 includes n-type impurities. The n-type impurities are, for example, phosphorus (P) or arsenic (As).

The p$^+$ contact region 32 is provided so as to come into contact with the front surface P1 of the semiconductor layer 10. The contact region 32 includes p-type impurities. The p-type impurities are, for example, boron (B). The p-type impurity concentration of the contact region 32 is higher than the p-type impurity concentration of the base region 34. The contact region 32 has a function of reducing the contact resistance of the first common electrode 20. In addition, the contact region 32 has a function of sweeping holes which have been injected and accumulated in the drift region 18.

The p+ collector region 36 is provided between the emitter region 30 and the rear surface P2 of the semiconductor layer 10. The collector region 36 is provided so as to come into contact with the rear surface P2 of the semiconductor layer 10. The collector region 36 includes p-type impurities. The p-type impurities are, for example, boron (B). The collector region 36 has a function of injecting holes into the drift region 18 and reducing the contact resistance of the second common electrode 22.

The n− drift region 18 is provided between the emitter region 30 and the collector region 36. The drift region 18 includes n-type impurities. The n-type impurities are, for example, phosphorus (P).

The p-type base region 34 is provided between the emitter region 30 and the drift region 18. The p-type base region 34 includes p-type impurities. The p-type impurities are, for example, boron (B). The p-type base region 34 functions as a channel region in which an inversion layer is formed when the IGBT is turned on.

For example, the p-type base region 34 is formed at the same time as the anode region 12 of the cell diode portion 111. For example, the base region 34 has substantially the same impurity concentration and depth as the anode region 12.

In the specification, the term "depth" means a distance from the first plane P1 to an end portion of each region which is close to the second plane P2.

Here, the trench 44 indicates a portion of the semiconductor layer 10. The trench 44 extends in depth direction in the semiconductor layer 10. The trench 44 is provided in the first plane P1 of the semiconductor layer 10 so as to pass through the base region 34 and has a bottom which reaches the drift region 18.

The gate insulating film 46 is provided in the trench 44. The gate insulating film 46 is made of, for example, silicon oxide.

The gate electrode 48 is provided in the trench 44. The gate electrode 48 is provided on the gate insulating film 46. A gate voltage that is applied to the gate electrode 48 is controlled to control the turn-on and turn-off of the IGBT. The gate electrode 48 is made of, for example, polysilicon including conductive impurities.

The first common electrode 20 functions as an emitter electrode of the IGBT in the cell IGBT portion 113. The contact between the first common electrode 20 and the emitter region 30 is an ohmic contact.

The second common electrode 22 functions as a collector electrode of the IGBT in the cell IGBT portion 113. The contact between the second common electrode 22 and the collector region 36 is an ohmic contact.

The insulating layer 49 is provided between the first common electrode 20 and the gate electrode 48. The insulating layer 49 electrically separates the first common electrode 20 from the gate electrode 48.

Figure 4:
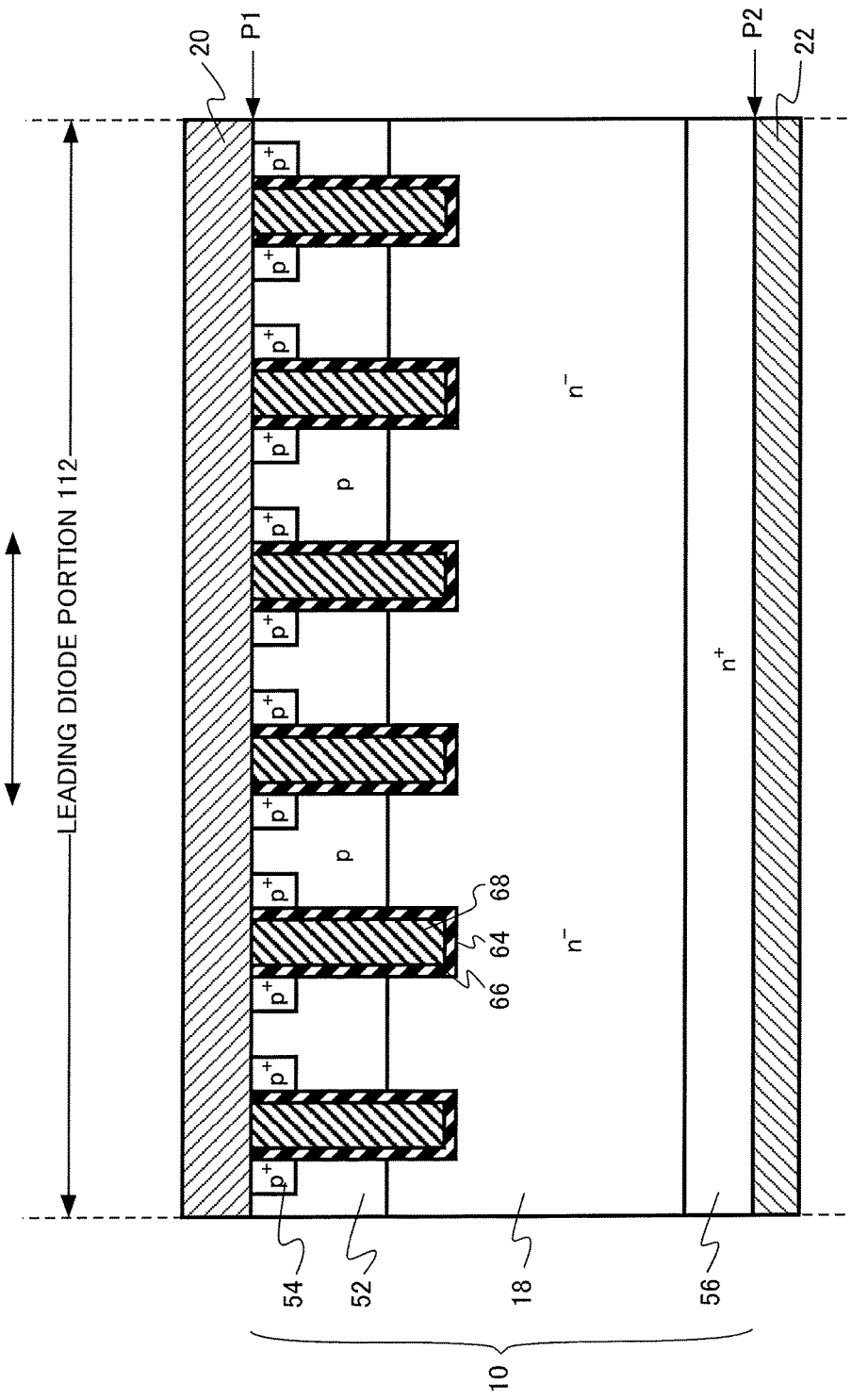
FIG. 4 is a cross-sectional view schematically illustrating a portion of the active region of the semiconductor device according to the first embodiment.

FIG. 4 is a cross-sectional view schematically illustrating a portion of the active region of the semiconductor device according to the first embodiment. FIG. 4 illustrates the cross section taken along the line B-B' of FIG. 2. FIG. 4 is a cross-sectional view illustrating the leading diode portion 112.

A diode is provided in the leading diode portion 112. When the RC-IGBT 100 changes to a reverse conduction mode in a state in which a positive voltage is applied to the gate electrode, the diode in the leading diode portion 112 is turned on ahead of the diode in the cell diode portion 111.

The leading diode portion 112 includes a semiconductor layer 10, a p-type anode region 52 (second anode region), a p+ contact region 54, an n− cathode region 56 (second cathode region), the n− drift region 18, the first common electrode 20, and the second common electrode 22. In addition, the leading diode portion 112 includes a trench 64 (second trench), a trench insulating film 66 (second trench insulating film), and a trench electrode 68 (second trench electrode).

The p-type anode region 52 (second anode region), the p+ contact region 54, the n+ cathode region 56 (second cathode region), the trench 64 (second trench), the trench insulating film 66 (second trench insulating film), and the trench electrode 68 (second trench electrode) in the leading diode portion 112 have the same configurations and functions as the p-type anode region 12 (first anode region), the p+ contact region 14, the n+ cathode region 16 (first cathode region), the trench 24 (first trench), the trench insulating film 26 (first trench insulating film), and the trench electrode 28 (first trench electrode) in the cell diode portion 111, respectively.

The first common electrode 20 functions as an anode electrode of the diode in the leading diode portion 112. The second common electrode 22 functions as a cathode electrode of the diode in the leading diode portion 112.

The width (W2 in FIG. 2) of the leading diode portion 112 in the first direction is greater than the width (W1 in FIG. 2) of the cell diode portion 111 in the second direction. The width (W2 in FIG. 2) of the leading diode portion 112 in the first direction is, for example, equal to or greater than 60 μm.

Figure 5:
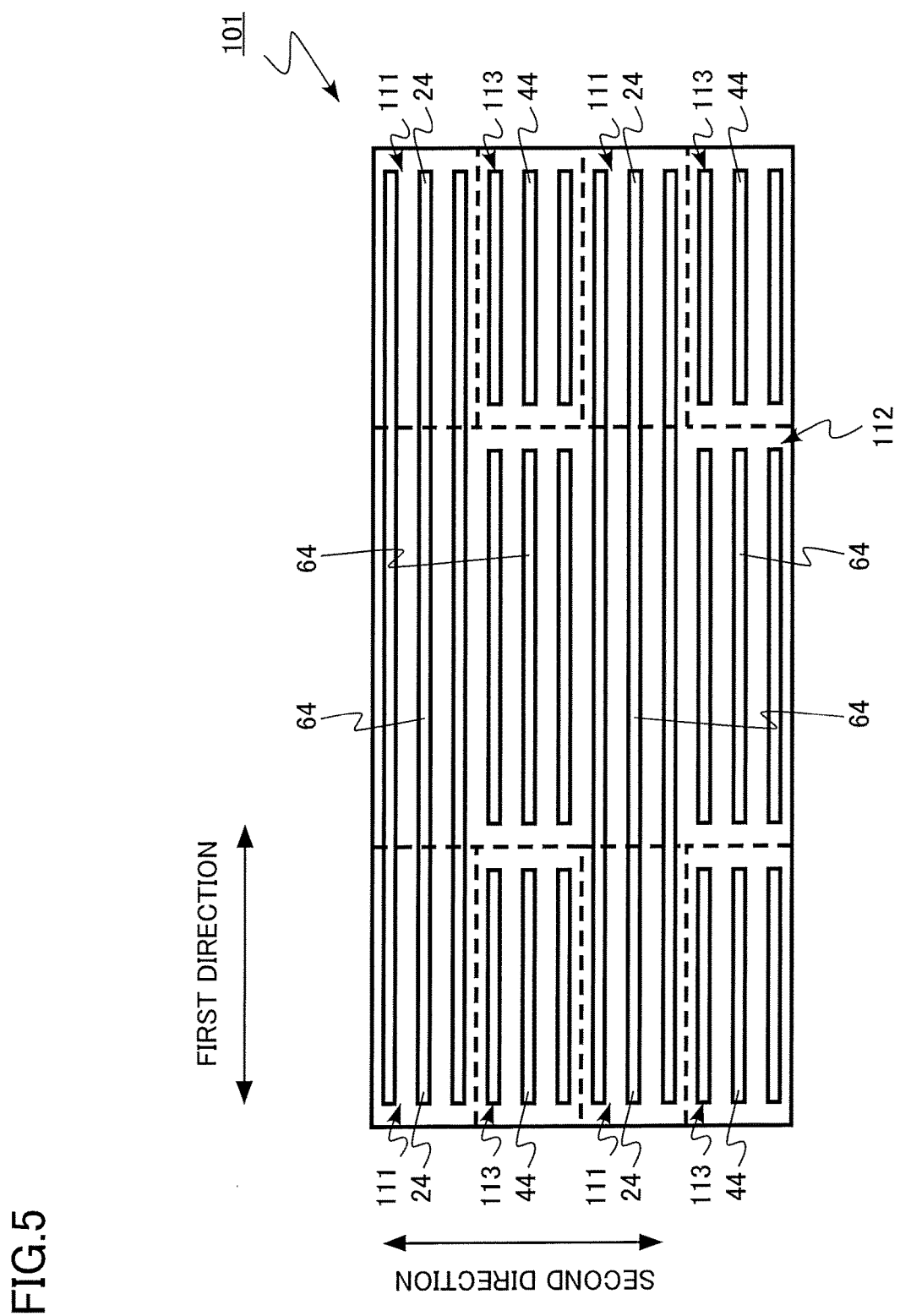
FIG. 5 is a plan view schematically illustrating the active region of the semiconductor device according to the first embodiment.

FIG. 5 is a plan view schematically illustrating the active region of the semiconductor device according to the first embodiment. FIG. 5 is a diagram illustrating the layout pattern of the trench 24 (first trench) in the cell diode portion 111, the trench 64 (second trench) in the leading diode portion 112, and the trench 44 (third trench) in the cell IGBT portion 113.

The trench 24, the trench 64, and the trench 44 extend in the first direction. The trench 24 and the trench 64 are continuous with each other. Since the trench 24 and the trench 64 are continuous with each other, the trench electrode 28 in the trench 24 and the trench electrode 68 in the trench 64 are connected to each other.

The trench 64 and the trench 44 are separated from each other. Since the trench 64 and the trench 44 are separated from each other, the trench electrode 68 in the trench 64 and the gate electrode 48 in the trench 44 are separated from each other.

Figure 6:
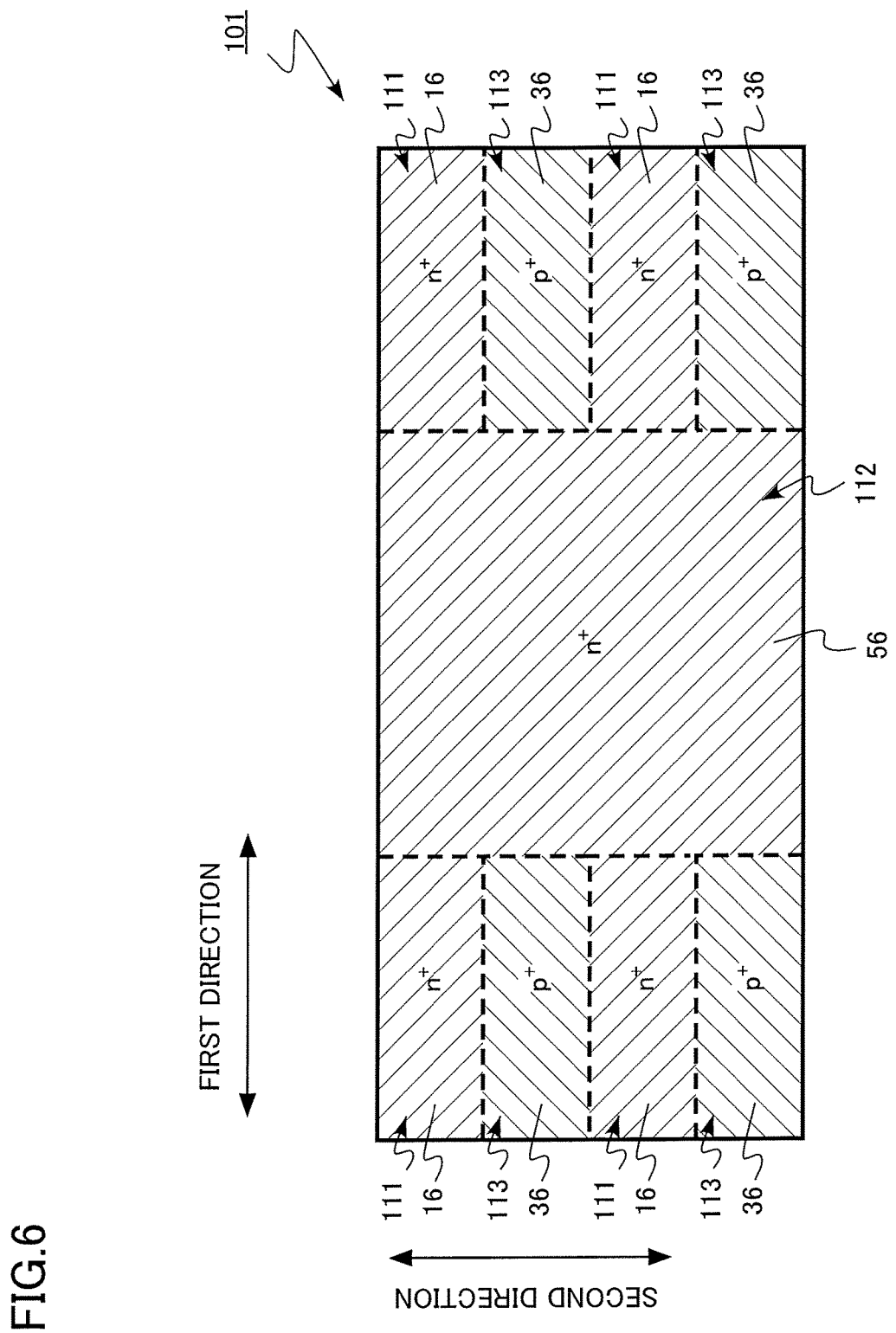
FIG. 6 is a plan view schematically illustrating the active region of the semiconductor device according to the first embodiment.

FIG. 6 is a plan view schematically illustrating the active region of the semiconductor device according to the first embodiment. FIG. 6 is a diagram illustrating the layout pattern of the n+ cathode region 16 (first cathode region) in the cell diode portion 111, the n+ cathode region 56 (second cathode region) in the leading diode portion 112, and the p+ collector region 36 in the cell IGBT portion 113.

The n+ cathode region 16 and the p+ collector region 36 are alternately arranged in the second direction. The n+ cathode region 16 and the p− collector region 36 are physically connected to each other.

The n− cathode region 56 and the n+ cathode region 16 are provided side by side in the first direction. The n+ cathode region 56 and the p+ collector region 36 are provided side by side in the first direction. The n+ cathode region 56 and the n+ cathode region 16 are physically connected to each other.

Next, the function and effect of the first embodiment will be described.

Figure 7:
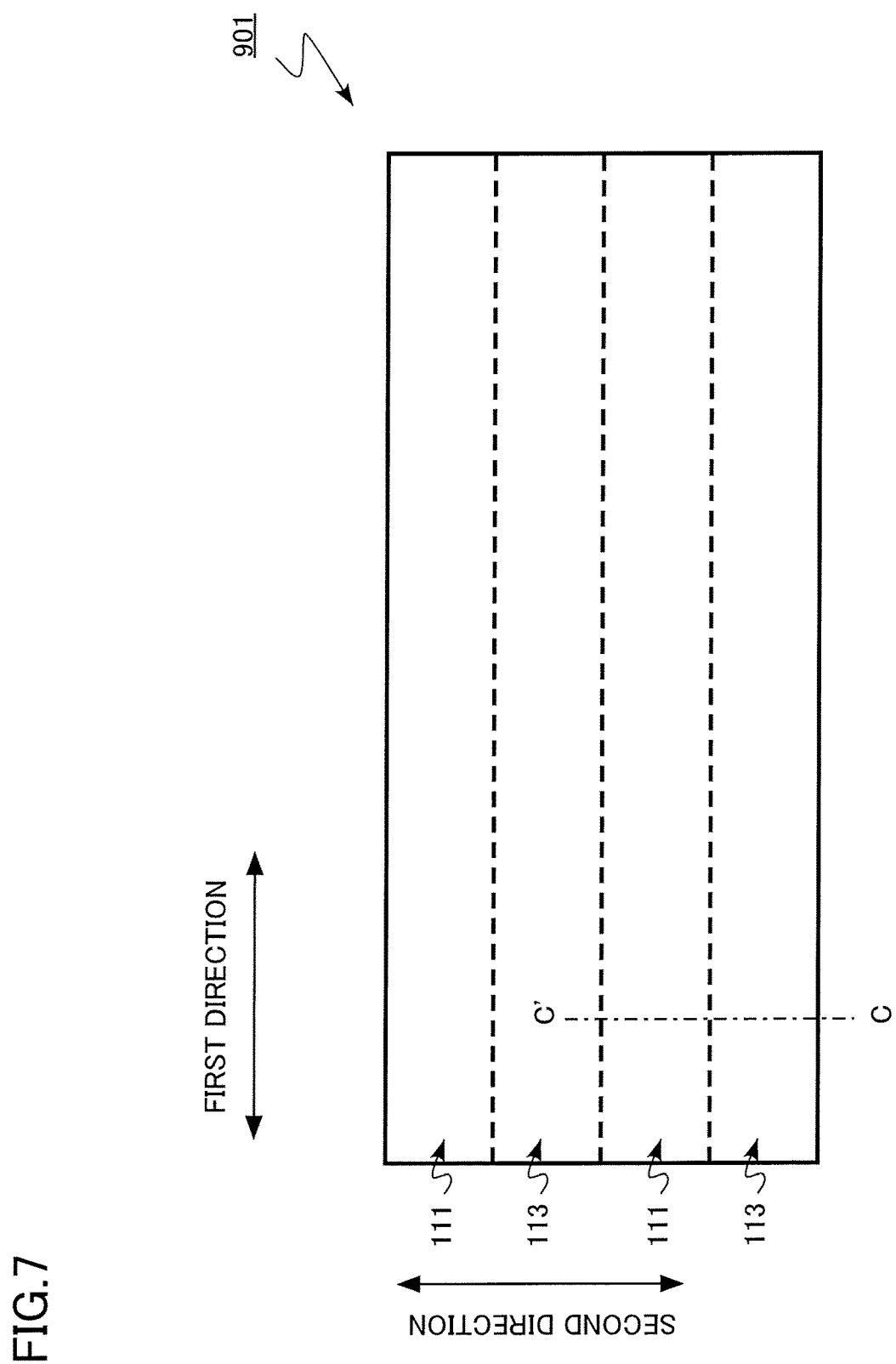
FIG. 7 is a plan view schematically illustrating an active region of a semiconductor device according to a comparative example.

FIG. 7 is a plan view schematically illustrating an active region of a semiconductor device according to a comparative example. The semiconductor device according to the comparative example is an RC-IGBT having a trench structure.

The RC-IGBT according to the comparative example includes an active region 901. The active region 901 includes a plurality of cell diode portions 111 and a plurality of cell IGBT portions 113. The RC-IGBT according to the comparative example differs from the RC-IGBT 100 according to the first embodiment in that it does not include the leading diode portion 112. The cell diode portion 111 and the cell IGBT portion 113 have the same configurations as those in the RC-IGBT 100 according to the first embodiment.

Figure 8:
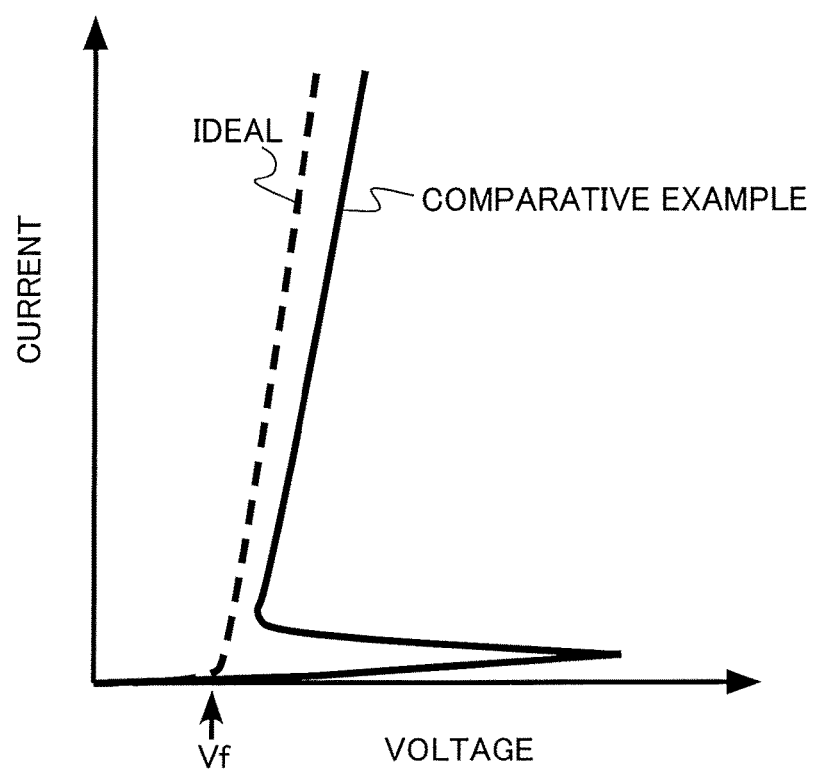
FIG. 8 is a diagram illustrating the current-voltage characteristics of the semiconductor device according to the comparative example.

FIG. 8 is a diagram illustrating the current-voltage characteristics of the semiconductor device according to the comparative example. FIG. 8 illustrates the current-voltage characteristics when the RC-IGBT according to the comparative example changes to the reverse conduction mode in a state in which a positive voltage is applied to a gate electrode. A solid line indicates the current-voltage characteristics in the case of the comparative example and a dotted line indicates ideal current-voltage characteristics.

In the reverse conduction mode of the RC-IGBT, the diode in the cell diode portion 111 performs a forward operation. Theoretically, the amount of current rapidly increases at a forward voltage (Vf). However, in the RC-IGBT according to the comparative example, the phenomenon in which a rapid increase in the amount of current is prevented up to a predetermined voltage, that is, snapback occurs.

For example, in a case in which a plurality of RC-IGBTs are connected in parallel to each other, when snapback occurs in the cell diode portion 111, the amounts of current flowing through each RC-IGBT are likely to be unbalanced. When the current unbalance occurs, there is a concern that an excessive current will flow to a specific RC-IGBT and the specific RC-IGBT will be broken.

Figure 9:
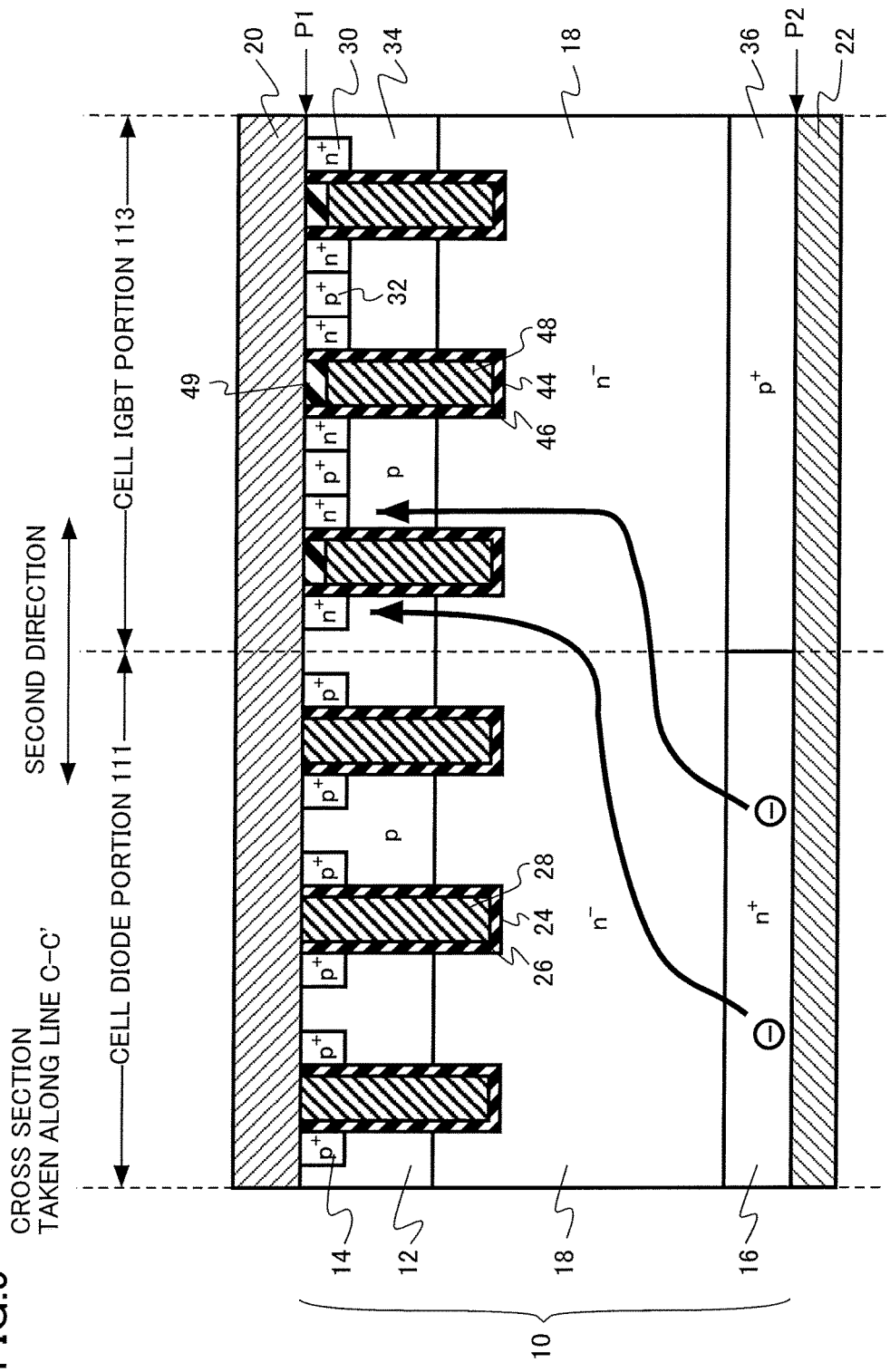
FIG. 9 is a cross-sectional view schematically illustrating a portion of the active region of the semiconductor device according to the comparative example.

FIG. 9 is a cross-sectional view schematically illustrating a portion of the active region of the semiconductor device according to the comparative example. FIG. 9 illustrates the cross section taken along the line C-C' of FIG. 7. FIG. 9 is a cross-sectional view illustrating the cell diode portion 111 and the cell IGBT portion 113.

In the reverse conduction mode of the RC-IGBT, a voltage that is positive with respect to the second common electrode 22 is applied to the first common electrode 20. In the reverse conduction mode of the RC-IGBT, in some cases, a gate voltage when the IGBT is turned on is applied to the gate electrode 48 of the cell IGBT portion 113. In this case, an inversion layer is formed in the base region 34 and a channel region is formed.

Since the channel region is formed in the IGBT of the cell IGBT portion 113, the path of electrons from the second common electrode 22 to the first common electrode 20 through the cathode region 16, the drift region 18, the base region 34, and the emitter region 30 is formed. Therefore, electrons in the cell diode portion 111 are exhausted to the first common electrode 20 through the cell IGBT portion 113. Therefore, it is considered that the carrier concentration of the cell diode portion 111 does not increase, an increase in the amount of current in the diode of the cell diode portion 111 is prevented, and snapback occurs.

In the RC-IGBT 100 according to the first embodiment, the leading diode portion 112 is newly provided. The width (W2 in FIG. 2) of the leading diode portion 112 in the first direction is greater than the width (W1 in FIG. 2) of the cell diode portion 111 in the second direction. The leading diode portion 112 has a region that is distant from the cell IGBT portion 113.

In the region that is distant from the cell IGBT portion 113, the emission of electrons from the cell IGBT portion 113 is prevented in the reverse conduction mode and the snapback of the diode is prevented. Therefore, the diode in the leading diode portion 112 has the ideal current-voltage characteristics represented by the dotted line in FIG. 8 in which the amount of current increases rapidly at the forward voltage (Vf).

When the diode in the leading diode portion 112 has the current-voltage characteristics in which the amount of current increases rapidly at the forward voltage (Vf), carriers are supplied from the leading diode portion 112 to the cell diode portion 111 connected to the leading diode portion 112.

Therefore, the amount of current in the cell diode portion 111 also increases rapidly at the forward voltage (Vf). In other words, snapback is also prevented in the cell diode portion 111 and the cell diode portion 111 has the ideal current-voltage characteristics in which the amount of current increases rapidly at the forward voltage (Vf).

It is preferable that the width (W2 in FIG. 2) of the leading diode portion 112 in the first direction be equal to or greater than 60 μm. The results of device simulations prove that, when the distance from the cell IGBT portion 113 is equal to or greater than 60 μm, the snapback in the diode is sufficiently prevented. When the cell IGBT portions 113 are provided on both sides of the leading diode portion 112 as in the RC-IGBT 100 according to the first embodiment, it is preferable that the width (W2 in FIG. 2) of the leading diode portion 112 in the first direction be equal to or greater than 120 μm.

According to the first embodiment, it is possible to achieve the RC-IGBT 100 in which snapback in a diode is prevented in the reverse conduction mode.

Second Embodiment

A semiconductor device according to a second embodiment differs from the semiconductor device according to the first embodiment in that the first collector region is provided in the first diode portion. Hereinafter, the description of a portion of the same content as that in the first embodiment will not be repeated.

An RC-IGBT according to the second embodiment is the same as the RC-IGBT according to the first embodiment except the layout pattern of the cathode region 16, the cathode region 56, and the collector region 36.

Figure 10:
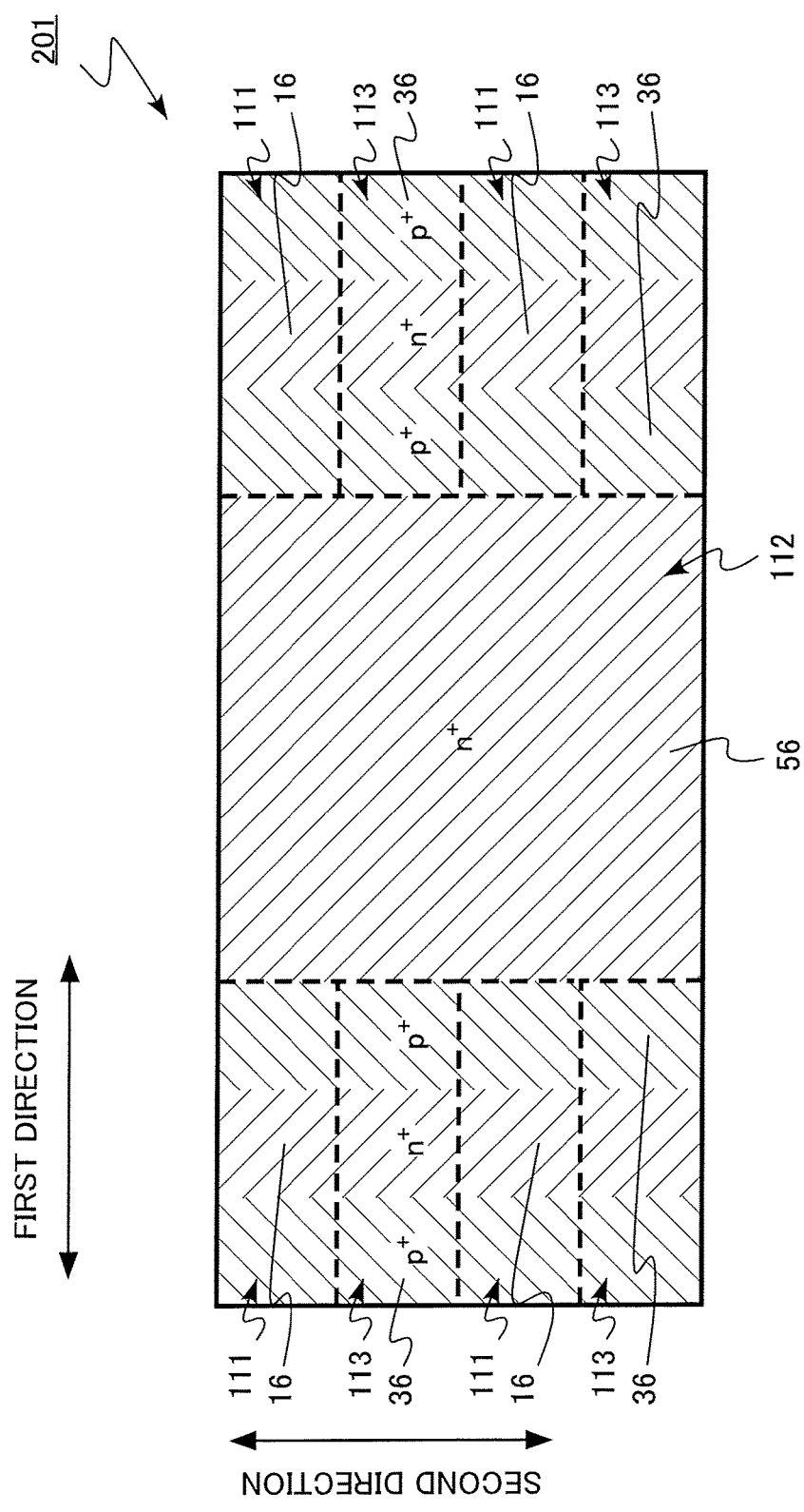
FIG. 10 is a plan view schematically illustrating an active region of a semiconductor device according to a second embodiment.

FIG. 10 is a plan view schematically illustrating an active region of the semiconductor device according to the second embodiment. The semiconductor device according to the second embodiment is an RC-IGBT having a trench structure.

An active region 201 includes a plurality of cell diode portions 111 (first diode portions), a leading diode portion 112 (second diode portion), and a plurality of cell IGBT portions 113 (first IGBT portions).

FIG. 10 illustrates the layout pattern of an n$^+$ cathode region 16 (first cathode region) in the cell diode portion 111, an n$^+$ cathode region 56 (second cathode region) in the leading diode portion 112, and a p$^+$ collector region 36 in the cell IGBT portion 113.

The p+ collector region 36 of the cell IGBT portion 113 is also provided in the cell diode portion 111. The p+ collector region 36 is also present in the rear surface P2 of the cell diode portion 111.

The n+ cathode region 16 of the cell diode portion 111 is provided in the cell IGBT portion 113. The n+ cathode region 16 is also present in the rear surface P2 of the cell IGBT portion 113.

The n+ cathode region 16 and the p+ collector region 36 are alternately arranged in the first direction. The cathode region 16 and the p+ collector region 36 are connected to each other.

In the RC-IGBT according to the second embodiment, the p+ collector region 36 is also present in the rear surface P2 of the cell diode portion 111. Therefore, when an IGBT in the cell IGBT portion 113 is turned on, an on-current of the IGBT also flows to the cell diode portion 111. In other words, the cell diode portion 111 functions as an effective region of the IGBT. Therefore, an on-current increases when the RC-IGBT is turned on.

According to the second embodiment, similarly to the first embodiment, it is possible to achieve an RC-IGBT in which snapback in a diode is prevented in the reverse conduction mode. In addition, it is possible to achieve an RC-IGBT in which an on-current increases when the RC-IGBT is turned on.

Third Embodiment

A semiconductor device according to a third embodiment differs from the semiconductor device according to the first embodiment in that the semiconductor device further includes a second IGBT portion, the second IGBT portion is provided so as to be adjacent to the first diode portion and the second diode portion in the second direction and includes a second emitter region of the second conductivity type provided in the semiconductor layer, a second collector region of the first conductivity type provided between the second emitter region and the second plane, the drift region provided between the second emitter region and the second collector region, a second base region of the first conductivity type provided between the second emitter region and the drift region, a fourth trench which is provided in the semiconductor layer and extends in the first direction, a second gate insulating film provided in the fourth trench, and a second gate electrode provided on the second gate insulating film in the fourth trench, the second collector region and the first collector region are physically connected to each other, and the width of the second collector region in the second direction is greater than the width of the first collector region in the first direction. Hereinafter, the description of a portion of the same content as that in the first embodiment will not be repeated.

Figure 11:
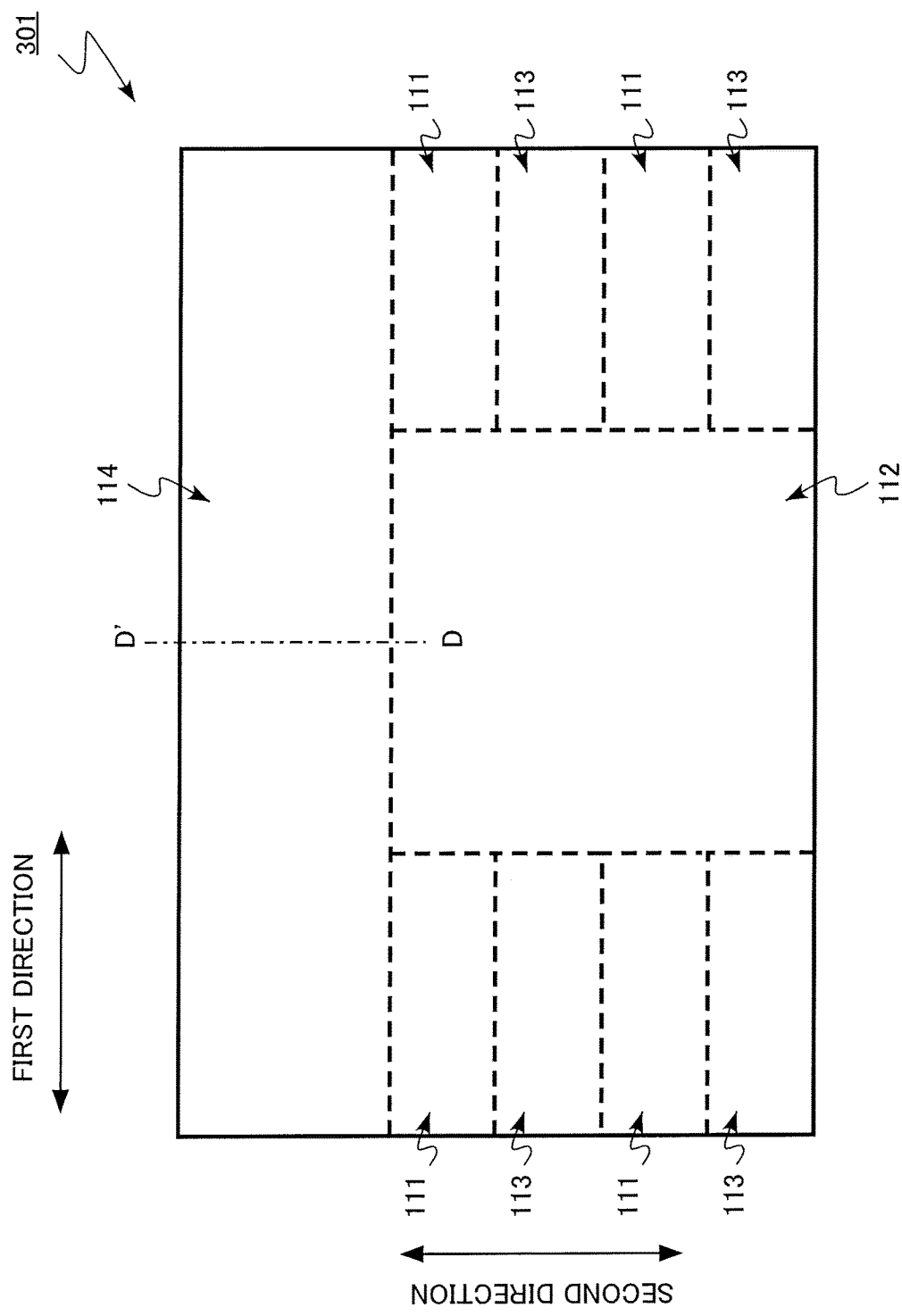
FIG. 11 is a plan view schematically illustrating an active region of a semiconductor device according to a third embodiment.

FIG. 11 is a plan view schematically illustrating an active region of the semiconductor device according to the third embodiment. The semiconductor device according to the third embodiment is an RC-IGBT having a trench structure.

An active region 301 includes a plurality of cell diode portions 111 (first diode portions), a leading diode portion 112 (second diode portion), a plurality of cell IGBT portions 113 (first IGBT portions), and a leading IGBT portion 114 (second IGBT portion). In addition, the first direction and the second direction are perpendicular to each other.

The cell diode portion 111 and the cell IGBT portion 113 are provided so as to be adjacent to each other in the second direction. The cell diode portion 111 and the cell IGBT portion 113 are alternately arranged in the second direction.

The leading diode portion 112 is provided so as to be adjacent to the cell diode portion 111 in the first direction. The cell IGBT portion 113 is provided so as to be adjacent to the leading diode portion 112 in the first direction.

The leading IGBT portion 114 is provided so as to be adjacent to the cell diode portion 111 and the leading diode portion 112 in the second direction.

Figure 12:
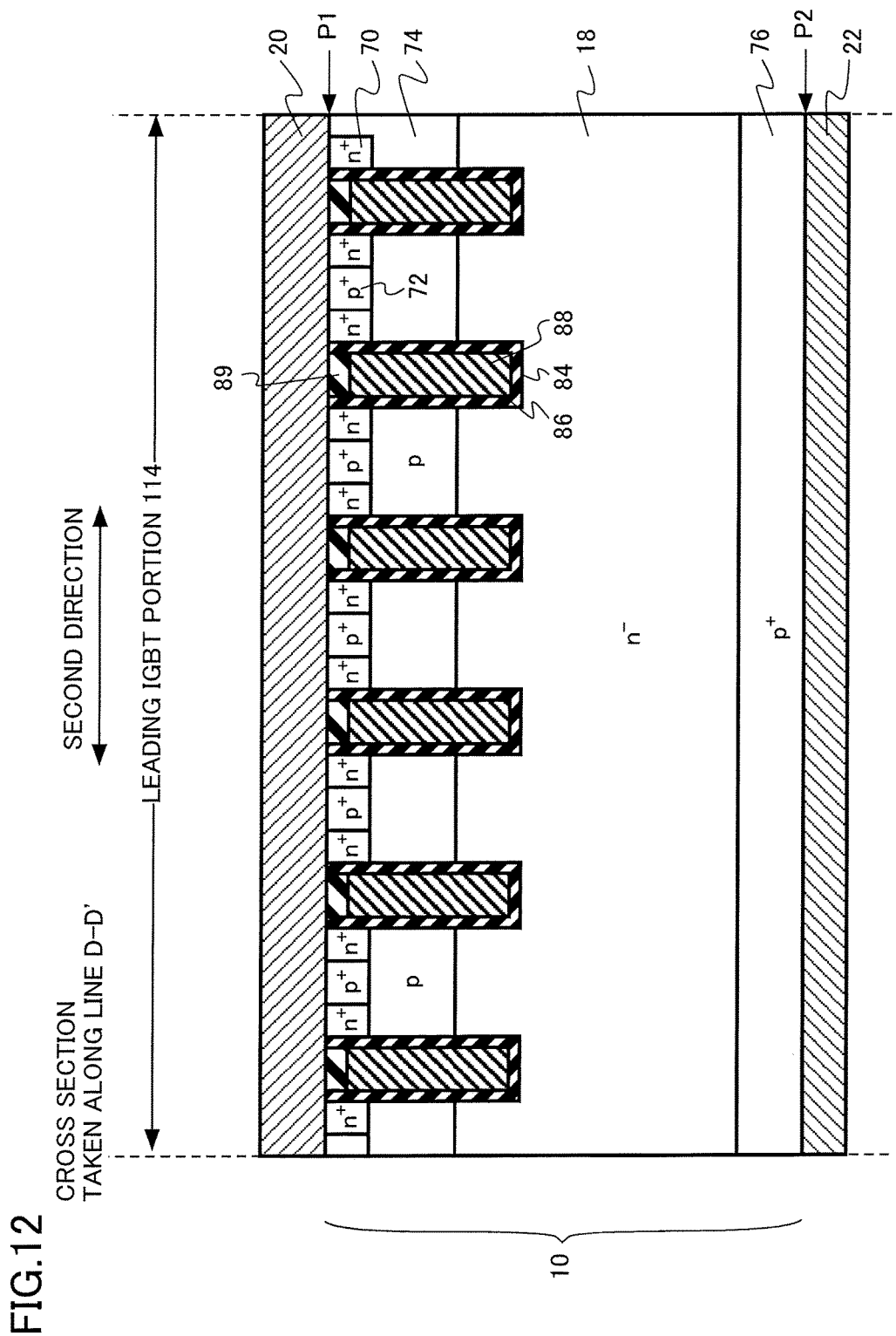
FIG. 12 is a cross-sectional view schematically illustrating a portion of the active region of the semiconductor device according to the third embodiment.

FIG. 12 is a cross-sectional view schematically illustrating a portion of the active region of the semiconductor device according to the third embodiment. FIG. 12 illustrates the cross section taken along the line D-D' of FIG. 11. FIG. 12 is a cross-sectional view illustrating the leading IGBT portion 114.

An IGBT is provided in the leading IGBT portion 114. The leading IGBT portion 114 includes a semiconductor layer 10, an n+ emitter region 70 (second emitter region), a p+ contact region 72, a p-type base region 74 (second base region), a p+ collector region 76 (second collector region), an n− drift region 18, a first common electrode 20, and a second common electrode 22. In addition, the leading IGBT portion 114 includes a trench 84 (fourth trench), a gate insulating film 86 (second gate insulating film), a gate electrode 88 (second gate electrode), and an insulating layer 89.

The n+ emitter region 70 (second emitter region), the p+ contact region 72, the p-type base region 74 (second base region), the p+ collector region 76 (second collector region), the trench 84 (fourth trench), the gate insulating film 86 (second gate insulating film), the gate electrode 88 (second gate electrode), and the insulating layer 89 in the leading IGBT portion 114 have the same configurations and functions as the n+ emitter region 30 (first emitter region), the p+ contact region 32, the p-type base region 34 (first base region), the p+ collector region 36 (first collector region), the trench 44 (third trench), the gate insulating film 46 (first gate insulating film), the gate electrode 48 (first gate electrode), and the insulating layer 49 in the cell IGBT portion 113, respectively.

Figure 13:
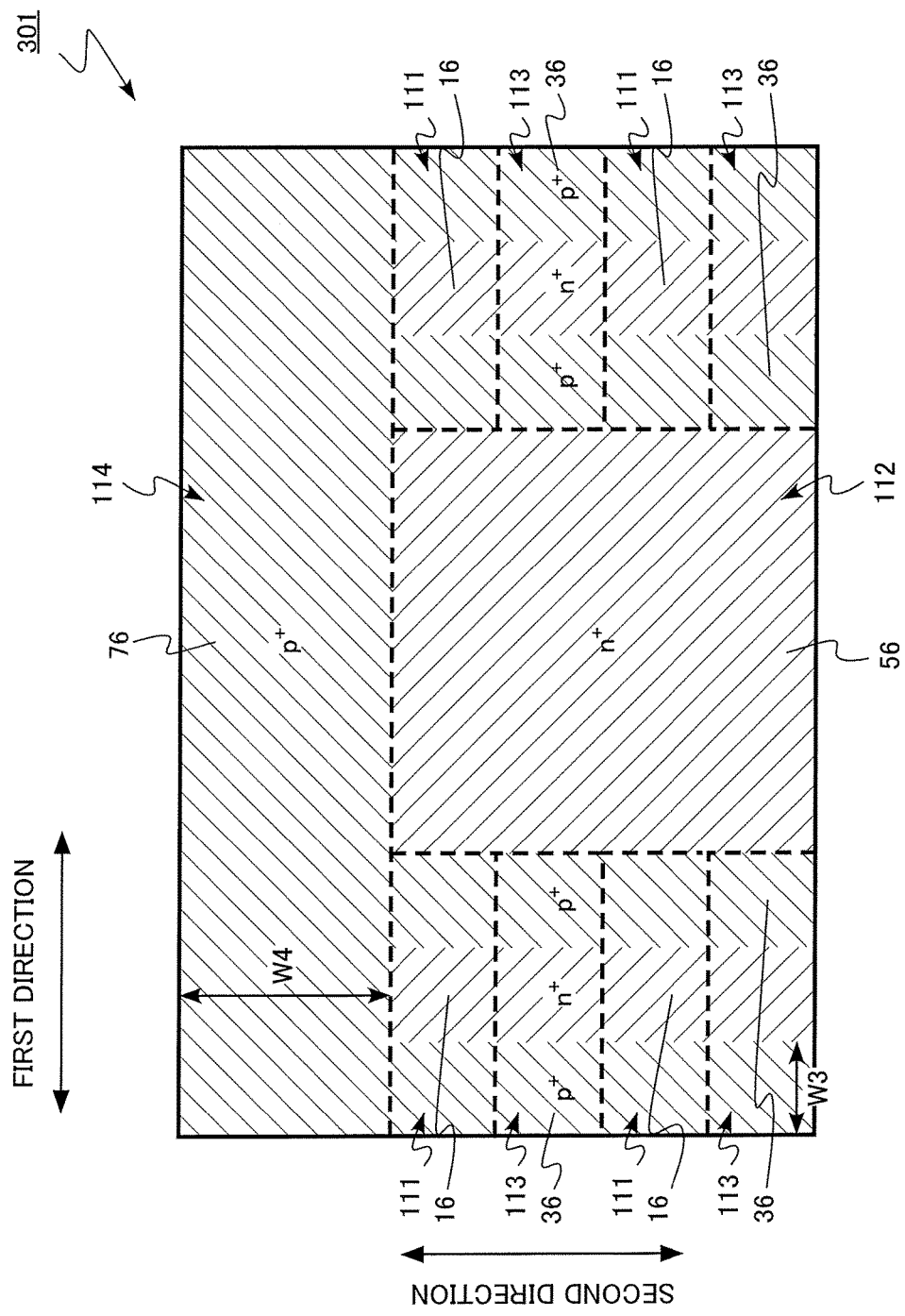
FIG. 13 is a plan view schematically illustrating the active region of the semiconductor device according to the third embodiment.

FIG. 13 is a plan view schematically illustrating the semiconductor device according to the third embodiment. FIG. 13 is a diagram illustrating the layout pattern of the n+ cathode region 16 (first cathode region) in the cell diode portion 111, the n+ cathode region 56 (second cathode region) in the leading diode portion 112, the p+ collector region 36 (first collector region) in the cell IGBT portion 113, and the p+ collector region 76 (second collector region) in the leading IGBT portion 114.

The p+ collector region 36 of the cell IGBT portion 113 extends to the cell diode portion 111. The p+ collector region 36 is also present in the cell diode portion 111.

In addition, the n− cathode region 16 of the cell diode portion 111 extends to the cell IGBT portion 113. The n+ cathode region 16 is also present in the cell IGBT portion 113.

The n+ cathode region 16 and the p+ collector region 36 are alternately arranged in the first direction. The n+ cathode region 16 and the p¹ collector region 36 are physically connected to each other.

The p¹ collector region 76 and the p¹ collector region 36 are physically connected to each other. The p+ collector region 76 and the n+ cathode region 16 are physically connected to each other.

The width (W4 in FIG. 13) of the p+ collector region 76 in the second direction is greater than the width (W3 in FIG. 13) of the p+ collector region 36 in the first direction.

Next, the function and effect of the third embodiment will be described.

For example, when the RC-IGBT according to the second embodiment is turned on, a voltage that is positive with respect to the first common electrode 20 is applied to the second common electrode 22. In addition, a positive gate voltage is applied to the gate electrode 48 such that a channel region is formed in the base region 34.

In the RC-IGBT according to the second embodiment, when the cell IGBT portion 113 is turned on, the path of electrons from the first common electrode 20 to the second common electrode 22 through the emitter region 30, the base region 34, the drift region 18, and the cathode region 16 in the cell IGBT portion 113 is formed. Therefore, electrons in the cell IGBT portion 113 are emitted from the second common electrode 22. As a result, the carrier concentration of the cell IGBT portion 113 does not increase, an increase in the amount of current in the IGBT of the cell IGBT portion 113 is prevented, and snapback occurs.

For example, in a case in which a plurality of RC-IGBTs are connected in parallel to each other, when snapback occurs in the cell IGBT portion 113, the amounts of current flowing through each RC-IGBT are likely to be unbalanced. When the current unbalance occurs, there is a concern that an excessive current will flow to a specific RC-IGBT and the specific RC-IGBT will be broken.

The RC-IGBT according to the third embodiment differs from the RC-IGBT according to the second embodiment in that the leading IGBT portion 114 is newly provided. The width (W4 in FIG. 13) of the $p^+$ collector region 76 in the leading IGBT portion 114 in the second direction is greater than the width (W3 in FIG. 13) of the $p^+$ collector region 36 in the cell IGBT portion 113 in the first direction. The leading IGBT portion 114 includes a region having the $p^+$ collector region 76 that is distant from the $n^+$ cathode region 16.

In the region having the $p^+$ collector region 76 that is distant from the cathode region 16 of the leading IGBT portion 114, when the IGBT is turned on, the emission of electrons from the second common electrode 22 is prevented. Therefore, snapback in the IGBT of the leading IGBT portion 114 is prevented.

When the IGBT of the leading IGBT portion 114 is turned on and the amount of current increases rapidly, carriers are supplied to the cell IGBT portion 113 that is connected to the leading IGBT portion 114 by the $p^+$ collector region 36. Therefore, the IGBT of the cell IGBT portion 113 is also turned on and the amount of current increases rapidly. As a result, snapback in the IGBT of the cell IGBT portion 113 is also prevented.

It is preferable that the width (W4 in FIG. 13) of the $p^+$ collector region 76 of the leading IGBT portion 114 in the second direction be equal to or greater than 600 μm. The results of device simulations prove that, when the distance of the $p^+$ collector region 76 from the $n^+$ cathode region 16 is equal to or greater than 600 μm, snapback in the IGBT is sufficiently prevented.

According to the third embodiment, similarly to the first embodiment, it is possible to achieve an RC-IGBT in which snapback in a diode is prevented in the reverse conduction mode.

In addition, similarly to the second embodiment, it is possible to achieve an RC-IGBT in which the amount of on-current increases when the RC-IGBT is turned on. Furthermore, it is possible to achieve an RC-IGBT in which snapback in an IGBT is prevented.

In the above-described embodiments, the semiconductor layer 10 is made of silicon. However, the semiconductor layer 10 may be made of other semiconductors such as SiC-based semiconductors and GaN-based semiconductors.

In the above-described embodiments, the first conductivity type is a p type and the second conductivity type is an n type. However, the first conductivity type may be an n type and the second conductivity type may be a p type.

While certain embodiments have been described, these embodiments have been presented by way of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first diode portion;
   a second diode portion; and
   a first IGBT portion,
   wherein the first diode portion includes:
   a first anode region of a first conductivity type provided in a semiconductor layer having a first plane and a second plane;
   a first cathode region of a second conductivity type provided between the first anode region and the second plane;
   a drift region of the second conductivity type provided between the first anode region and the first cathode region, the drift region having a lower second-conductivity-type impurity concentration than the first cathode region;
   a first trench provided in the semiconductor layer, the first trench extending in a first direction;
   a first trench insulating film provided in the first trench; and
   a first trench electrode provided on the first trench insulating film in the first trench, the first trench electrode being electrically connected to the first anode region,
   the second diode portion includes:
   a second anode region of the first conductivity type provided in the semiconductor layer;
   a second cathode region of the second conductivity type provided between the second anode region and the second plane;
   the drift region provided between the second anode region and the second cathode region;
   a second trench provided in the semiconductor layer, the second trench extending in the first direction; and
   a second trench insulating film provided in the second trench; and
   a second trench electrode provided on the second trench insulating film in the second trench, the second trench electrode being electrically connected to the second anode region,
   a width of the second diode portion in the first direction is greater than a width of the first diode portion in a second direction perpendicular to the first direction,
   a width of the second diode portion in the second direction is greater than the width of the first diode portion in a second direction,
   the second diode portion is provided so as to be adjacent to the first diode portion in the first direction,
   the second diode portion faces the first IGBT portion in the first direction, the first IGBT portion includes:
a first emitter region of the second conductivity type provided in the semiconductor layer;
a first collector region of the first conductivity type provided between the first emitter region and the second plane;
the drift region provided between the first emitter region and the first collector region;
a first base region of the first conductivity type provided between the first emitter region and the drift region;
a third trench provided in the semiconductor layer, the third trench extending in the first direction;
a first gate insulating film provided in the third trench; and
a first gate electrode provided on the first gate insulating film in the third trench,
the first IGBT portion is provided so as to be adjacent to the first diode portion in the second direction, and
the first IGBT portion is provided so as to be adjacent to the second diode portion in the first direction.

2. The semiconductor device according to claim 1, wherein the width of the second diode portion in the first direction is equal to or greater than 60 μm.

3. The semiconductor device according to claim 1, wherein the first trench and the second trench are continuous with each other.

4. The semiconductor device according to claim 1, wherein the second trench and the third trench are separated from each other.

5. The semiconductor device according to claim 1, wherein the first collector region is provided in the first diode portion.

6. The semiconductor device according to claim 5, wherein the first cathode region is provided in the first IGBT portion.

7. The semiconductor device according to claim 6, wherein the first collector region and the first cathode region are alternately arranged in the first direction, and
the first collector region and the first cathode region are connected to each other.

8. The semiconductor device according to claim 1, further comprising:
a second IGBT portion,
wherein the second IGBT portion is provided so as to be adjacent to the first diode portion and the second diode portion in the second direction,
the second IGBT portion includes:
a second emitter region of the second conductivity type provided in the semiconductor layer;
a second collector region of the first conductivity type provided between the second emitter region and the second plane;
the drift region provided between the second emitter region and the second collector region;
a second base region of the first conductivity type provided between the second emitter region and the drift region;
a fourth trench provided in the semiconductor layer, the fourth trench extending in the first direction;
a second gate insulating film provided in the fourth trench; and
a second gate electrode provided on the second gate insulating film in the fourth trench,
the second collector region and the first collector region are connected to each other, and
a width of the second collector region in the second direction is greater than a width of the first collector region in the first direction.

9. The semiconductor device according to claim 8, wherein the width of the second collector region in the second direction is equal to or greater than 600 μm.

10. The semiconductor device according to claim 1, wherein the semiconductor layer is made of single-crystal silicon.

11. The semiconductor device according to claim 1, wherein the first conductivity type is a p type and the second conductivity type is an n type.

* * * * *